US012740201B2

(12) United States Patent
Cheng

(10) Patent No.: US 12,740,201 B2
(45) Date of Patent: Sep. 15, 2026

(54) SEMICONDUCTOR STRUCTURE AND MANUFACTURING METHOD FOR SEMICONDUCTOR STRUCTURE

(71) Applicant: Enkris Semiconductor (Wuxi), Ltd., Wuxi (CN)

(72) Inventor: Kai Cheng, Wuxi (CN)

(73) Assignee: Enkris Semiconductor (Wuxi), Ltd., Wuxi (CN)

( * ) Notice: Subject to any disclaimer, the term of this patent is extended or adjusted under 35 U.S.C. 154(b) by 394 days.

(21) Appl. No.: 18/446,723

(22) Filed: Aug. 9, 2023

(65) Prior Publication Data

US 2024/0405166 A1 Dec. 5, 2024

(30) Foreign Application Priority Data

May 31, 2023 (CN) ......................... 202310637539.7

(51) Int. Cl.
*H10H 20/851* (2025.01)
*H10H 20/01* (2025.01)
*H10H 20/855* (2025.01)
*H10H 20/856* (2025.01)
*H10H 29/14* (2025.01)

(52) U.S. Cl.
CPC .... *H10H 20/8514* (2025.01); *H10H 20/8512* (2025.01); *H10H 20/856* (2025.01); *H10H 20/0361* (2025.01)

(58) Field of Classification Search
CPC ............... H10H 20/85; H10H 20/8514; H10H 20/8512; H10H 20/0361; H10H 20/856; H10H 20/8513
See application file for complete search history.

(56) References Cited

U.S. PATENT DOCUMENTS

2022/0231203 A1* 7/2022 Song .................. H10H 20/8513
2023/0275183 A1* 8/2023 Jean ................ H10H 20/01335

* cited by examiner

*Primary Examiner* — Antonio B Crite
(74) *Attorney, Agent, or Firm* — Westbridge IP LLC

(57) ABSTRACT

Disclosed are a semiconductor structure and a manufacturing method for the semiconductor structure. The semiconductor structure includes a light-emitting structure; a light control layer disposed on a side of the light-emitting structure, including a plurality of light control regions regularly arranged and a substrate structure located between the plurality of light control regions; where the plurality of light control regions include a wavelength conversion structure, and the wavelength conversion structure includes a quantum dot and a porous structure adsorbed with the quantum dot. In the present disclosure, the plurality of light control regions and the substrate structure are provided to ensure uniform light output, good directionality, high light extraction rate, and avoidance of light crosstalk in each light control region. The porous structure is utilized to adsorb the quantum dot and achieve a full color display, thereby improving resolution, simplifying a manufacturing process and reducing costs.

19 Claims, 12 Drawing Sheets

2051
204
203
202
201
100

SEMICONDUCTOR STRUCTURE AND MANUFACTURING METHOD FOR SEMICONDUCTOR STRUCTURE

CROSS-REFERENCE TO RELATED APPLICATIONS

The application claims priority to Chinese Patent Application No. 202310637539.7, filed on May 31, 2023, which is hereby incorporated by reference in its entirety.

TECHNICAL FIELD

The present disclosure relates to the field of semiconductor technologies, and in particular, to a semiconductor structure and a manufacturing method for the semiconductor structure.

BACKGROUND

Micro Light Emitting Diode (Micro-LED) technologies are also known as Light Emitting Diode (LED) micro display technologies. Compared to traditional LED display technologies, LED micro display technologies may reduce volume and weight of an overall system, and have a large space for reduction of manufacturing costs. Meanwhile, it also takes into account advantages of low power consumption, a high light energy utilization, a fast response speed, a wide working temperature range, and strong anti-interference ability.

However, there are still some technical challenges in the LED micro display technologies at present, for example, for LED micro display technologies, in order to improve pixels, a distance between core particles is very small, and an angle of emitted light is large, which may easily cause crosstalk between the core particles. In addition, the manufacturing costs and various performances (such as directionality and uniformity of light) of the LED micro display technologies also need to be further improved.

SUMMARY

In view of this, embodiments of the present disclosure provide a semiconductor structure and a manufacturing method for the semiconductor structure.

According to an aspect of the present disclosure, a semiconductor structure is provided by an embodiment of the present disclosure, including: a light-emitting structure; a light control layer disposed on a side of the light-emitting structure, where the light control layer includes a plurality of light control regions regularly arranged and a substrate structure located between the plurality of light control regions, the plurality of light control regions include a wavelength conversion structure, and the wavelength conversion structure includes a quantum dot and a porous structure adsorbed with the quantum dot.

As an optional embodiment, a material of the substrate structure includes silicon, and a material of the porous structure includes porous silicon oxide.

As an optional embodiment, the porous structure has a hole capable of adsorbing the quantum dot, the hole is columnar in shape, and an angle between the hole and a plane where the substrate structure is located ranges from 60° to 120°.

As an optional embodiment, each of the plurality of light control regions further includes an opening penetrating through the each of the plurality of light control regions, and the opening and the wavelength conversion structure are arranged horizontally to be separated by the substrate structure.

As an optional embodiment, a thickness of the light control layer, a thickness of the plurality of light control regions, and a thickness of the substrate structure are the same.

As an optional embodiment, a thickness of the light control layer is less than or equal to 50 μm.

As an optional embodiment, the plurality of light control regions include a first color light region, a second color light region, and a third color light region horizontally spaced.

As an optional embodiment, a hole proportion of the first color light region, a hole proportion of the second color light region, and a hole proportion of the third color light region are the same or different.

As an optional embodiment, a side wall of the plurality of light control regions is provided with a light reflection layer.

As an optional embodiment, a side wall of the plurality of light control regions is an inclined side wall, so that an equivalent diameter of the plurality of light control regions increases in a direction of light path.

As an optional embodiment, the light-emitting structure includes: a first semiconductor layer, an active layer, a second semiconductor layer, and at least one set of a first electrode and a second electrode; the first electrode is connected to the first semiconductor layer and blocked with the second semiconductor layer and the active layer through an insulating material; and the second electrode is connected to the second semiconductor layer and blocked with the first electrode through an insulating material.

As an optional embodiment, the light-emitting structure includes a plurality of light-emitting units, an insulation structure is arranged between two adjacent light-emitting units, and a thickness of the insulation structure is less than or equal to a thickness of the light-emitting structure.

According to another aspect of the present disclosure, a manufacturing method for a semiconductor structure is provided by an embodiment of the present disclosure, including: S1: providing a silicon substrate; S2: forming a light-emitting structure on a side of the silicon substrate; S3: thinning the silicon substrate from the other side, away from the light-emitting structure, of the silicon substrate; and S4: forming a plurality of light control regions regularly arranged in a remaining silicon substrate to form a light control layer, the light control layer further including a substrate structure arranged between the plurality of light control regions; where the plurality of light control regions include a wavelength conversion structure, and the wavelength conversion structure includes a quantum dot and a porous structures adsorbed with the quantum dot.

As an optional embodiment, a manufacturing method for the porous structure is to perform corrosion on a side, away from the light-emitting structure, of the silicon substrate after thinning the silicon substrate.

As an optional embodiment, Step S4 further includes: oxidizing the porous structure; and filling the porous structure oxidized with the quantum dot to form a wavelength conversion structure.

As an optional embodiment, Step S1 further includes: providing the silicon substrate; and preparing a hole on a side, away from a growth surface, of the silicon substrate, to form a plurality of porous structures regularly arranged.

As an optional embodiment, Step S2 includes forming the light-emitting structure on a side of the silicon substrate containing the plurality of porous structures, and Step S3 includes thinning the silicon substrate from the other side, away from the light-emitting structure, of the silicon substrate to expose the plurality of porous structures.

As an optional embodiment, Step S3 further includes: thinning the silicon substrate from the other side, away from the light-emitting structure, of the silicon substrate; and preparing holes on a side, away from the light-emitting structure, of the silicon substrate thinned to form the plurality of porous structures regularly arranged.

As an optional embodiment, Step S2 further includes: growing a first semiconductor layer, an active layer, and a second semiconductor layer on a side of the silicon substrate sequentially; forming at least one filling groove on a side, away from the silicon substrate, of the second semiconductor layer, where each of the at least one filling groove completely penetrates the second semiconductor layer, the active layer, and partially penetrates the first semiconductor layer; preparing a first electrode in the at least one filling groove, where the first electrode is insulated and blocked with the second semiconductor layer and the active layer, and the first electrode is connected to the first semiconductor layer; and preparing a second electrode on a side, away from the active layer, of the second semiconductor layer, where the second electrode is insulated and blocked with the first electrode.

As an optional embodiment, the light-emitting structure comprises a plurality of light-emitting units, and after the manufacturing method for a semiconductor structure further includes: forming an insulation structure between two adjacent light emitting units on a side, away from the silicon substrate, of the second semiconductor layer, where a thickness of the insulation structure is less than or equal to a thickness of the light-emitting structure.

DETAILED DESCRIPTION OF THE EMBODIMENTS

The technical schemes in the embodiments of the present disclosure will be described clearly and completely below in combination with the accompanying drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative efforts shall fall within the protection scope of the present disclosure.

In order to solve a technical problem of light crosstalk, the present disclosure provides a semiconductor structure and a manufacturing method for a semiconductor structure. The semiconductor structure includes a light-emitting structure; a light control layer disposed on a side of the light-emitting structure, including a plurality of light control regions regularly arranged and a substrate structure located between the plurality of light control regions; where the plurality of light control regions include a wavelength conversion structure, and the wavelength conversion structure includes a quantum dot and a porous structure adsorbed with the quantum dot. In the present disclosure, the plurality of light control regions and the substrate structure are provided to ensure uniform light output, good directionality, high light extraction rate, and avoidance of light crosstalk in each light control region. The porous structure is utilized to adsorb the quantum dot and achieve a full color display, thereby improving resolution, simplifying a manufacturing process and reducing costs.

The semiconductor structure and the manufacturing method for a semiconductor structure according to the present disclosure will be further illustrated exemplarily with reference to FIG. 1*a* to FIG. 21 below.

Figure 1A:
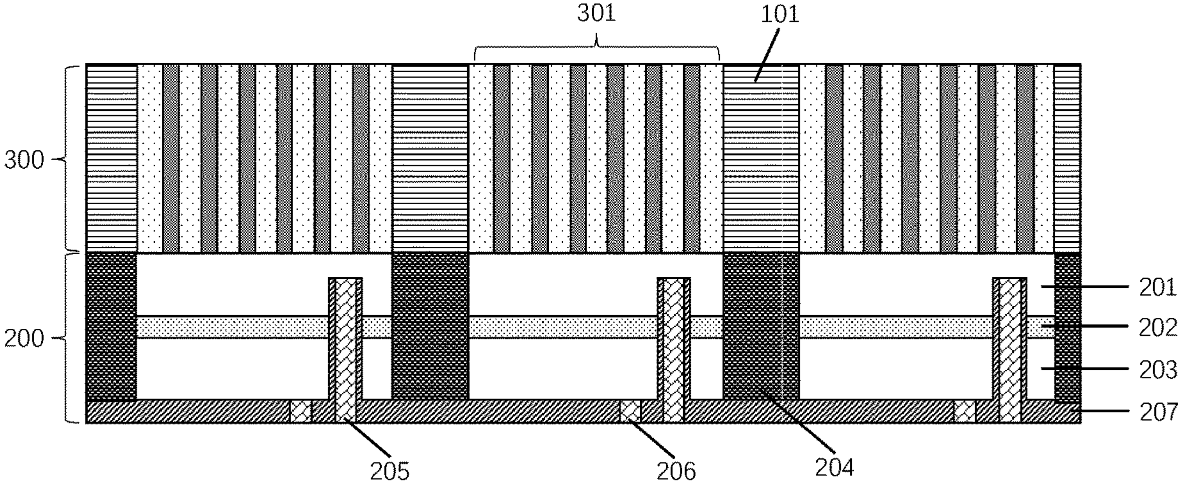
FIG. 1*a* to FIG. 1*f* are schematic diagrams of a semiconductor structure according to an embodiment of the present disclosure.

FIG. 1*a* to FIG. 1*f* are schematic diagrams of a semiconductor structure according to an embodiment of the present disclosure. As shown in FIG. 1*a*, the semiconductor structure includes: a light-emitting structure 200; a light control layer 300 disposed on a side of the light-emitting structure 200, where the light control layer 300 includes a plurality of light control regions 301 regularly arranged and a substrate structure 101 located between the plurality of light control regions 301, the plurality of light control regions 301 include a wavelength conversion structure, and the wavelength conversion structure includes a quantum dot and a porous structure adsorbed with the quantum dot.

In this embodiment, as shown in FIG. 1*a*, the light-emitting structure 200 includes a first semiconductor layer 201, an active layer 202, a second semiconductor layer 203, and at least one set of a first electrode 205 and a second electrode 206; where the first electrode 205 is connected to the first semiconductor layer 201 and blocked with the second semiconductor layer 203 and the active layer 202 through an insulating material 207; the second electrode 206 is connected to the second semiconductor layer 203 and blocked with the first electrode 205 through the insulating material 207. The light-emitting structure 200 includes a plurality of light-emitting units, and an insulation structure 204 is arranged between two adjacent light-emitting units. A thickness of the insulation structure 204 is less than or equal to a thickness of the light-emitting structure 200. Each of the plurality of light control regions 301 corresponds to at least one light-emitting unit.

Figure 1B:
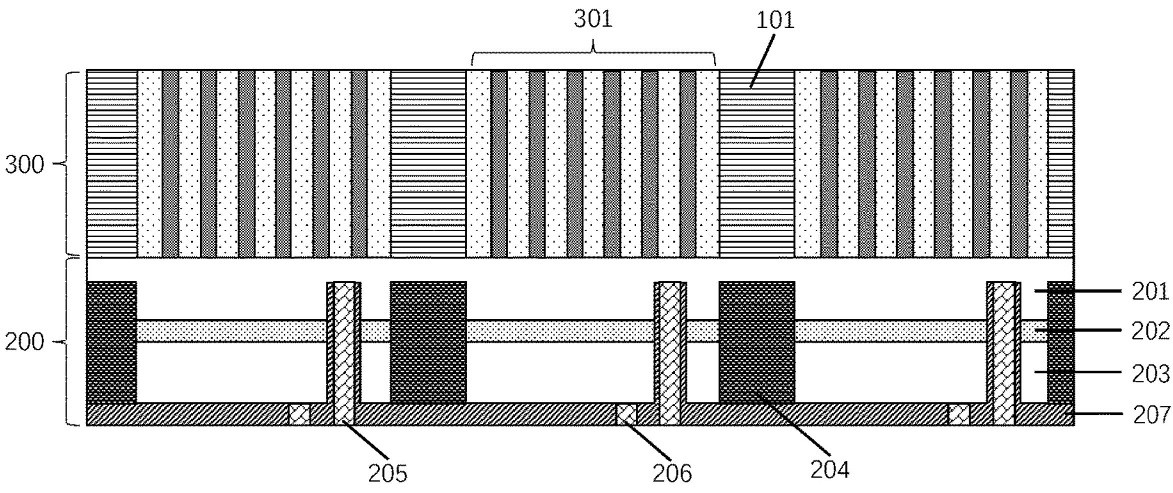
Figure 1C:
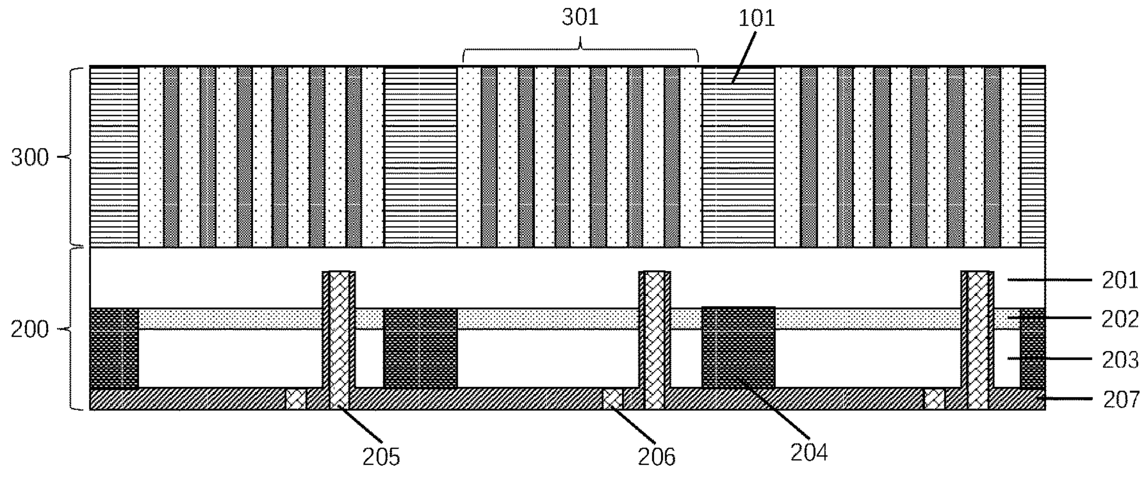
Figure 1D:
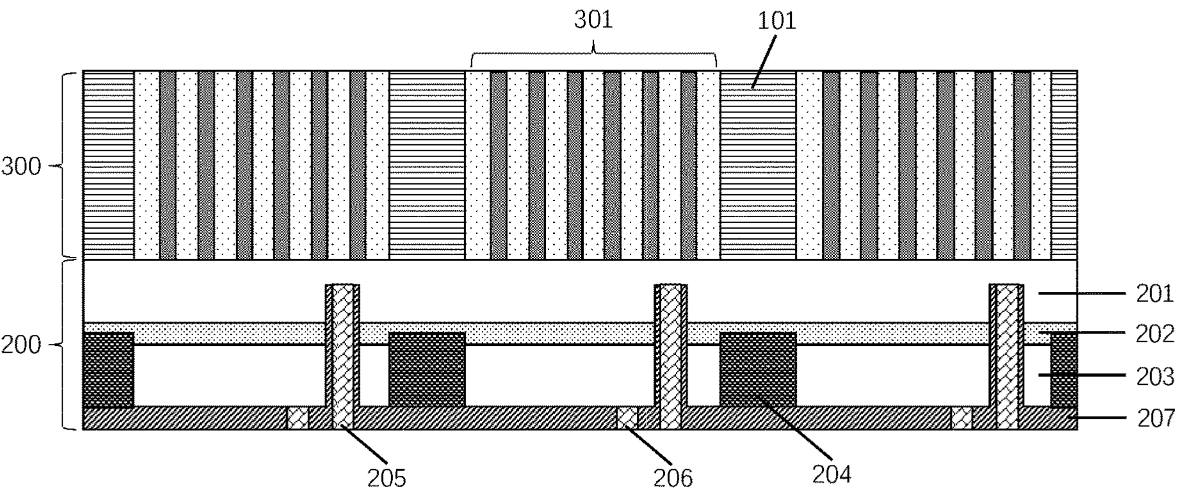
Figure 1E:
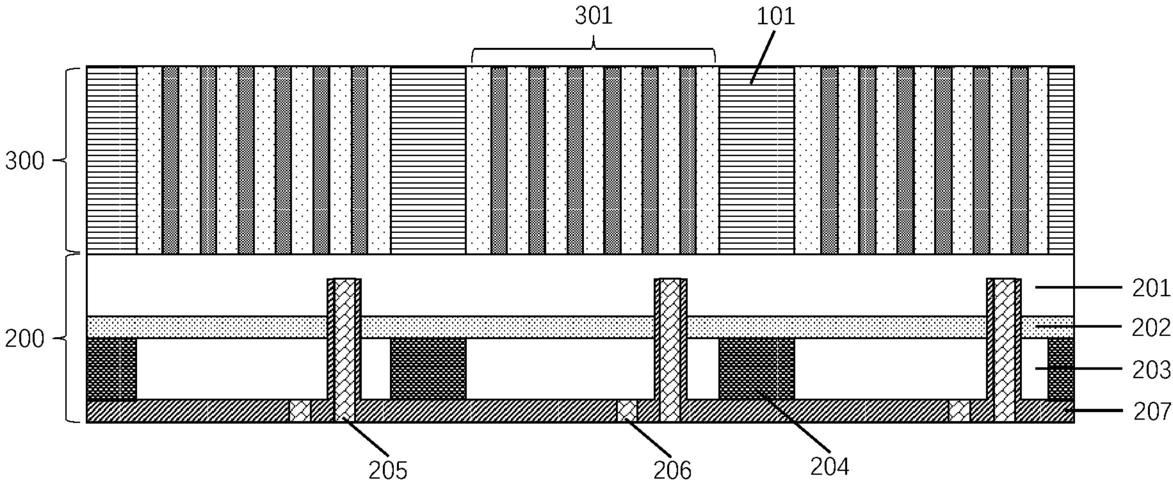
Figure 1F:
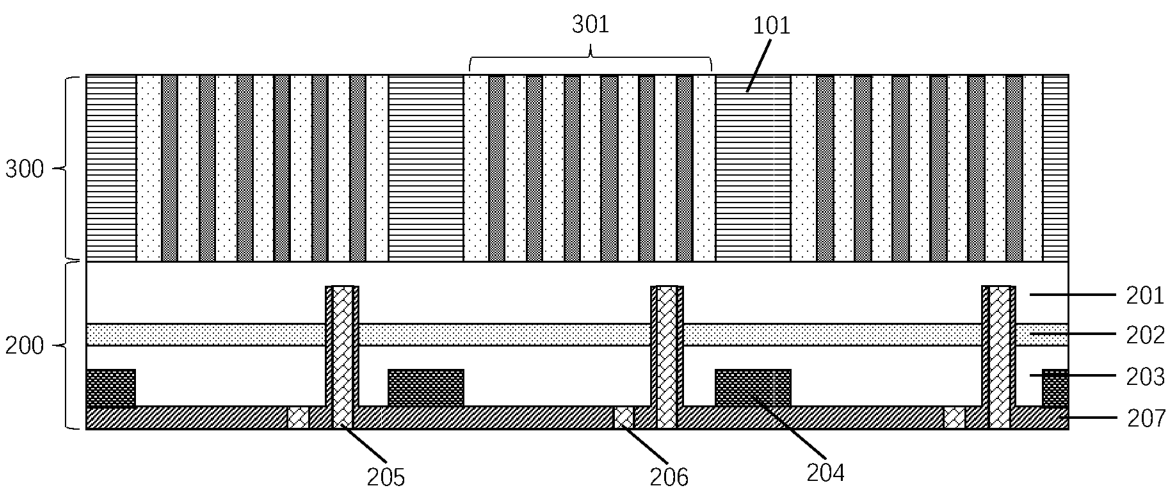

In this embodiment, as shown in FIG. 1*a*, the insulation structure 204 completely penetrates the first semiconductor layer 201 from a side, away from the light control layer 300, of the second semiconductor layer 203, so that the light emitting units are isolated from each other and non-radiative recombination at edge may be reduced. In other embodiments, the technical effect may be also obtained. As shown in FIG. 1*b*, the insulation structure 204 may partially penetrate the first semiconductor layer 201. As shown in FIG. 1*c*, the insulation structure 204 may completely penetrate the active layer 202. As shown in FIG. 1*d*, the insulation structure 204 may partially penetrate the active layer 202. As shown in FIG. 1*e*, the insulation structure 204 may completely penetrate the second semiconductor layer 203. As shown in FIG. 1*f*, the insulation structure 204 may partially penetrate the second semiconductor layer 203.

In this embodiment, materials of the first semiconductor layer 201 and the second semiconductor layer 203 are group III nitride materials, and the materials of the first semiconductor layer 201 and the second semiconductor layer 203 may be the same or different. The first semiconductor layer 201 is an n-type layer, and doped n-type ions may be at least one of Si ions, Ge ions, Sn ions, Se ions, and Te ions. The second semiconductor layer 203 is a p-type layer, and doped p-type ions may be at least one of Mg ions, Zn ions, Ca ions, Sr ions, and Ba ions. The active layer 202 includes a barrier layer and a well layer. A bandgap width of the barrier layer greater than a bandgap width of the well layer. For example, a material of the barrier layer is GaN, and a material of the well layer is InGaN.

In this embodiment, a material of the substrate structure 101 includes silicon, and a material of the porous structure includes silicon oxide. The porous structure is prepared in the silicon material, and after the porous structure is oxidized, a quantum dot is filled up to form a spaced and transparent light control region 301. There is no need to peel off the substrate and prepare a transparent light control region again, which simplifies the manufacturing process. A thickness of the light control layer 300, a thickness of the light control region 301, and a thickness of the substrate structure 101 are the same, and the thickness of the light control layer 300 is less than or equal to 50 μm.

Figure 2:
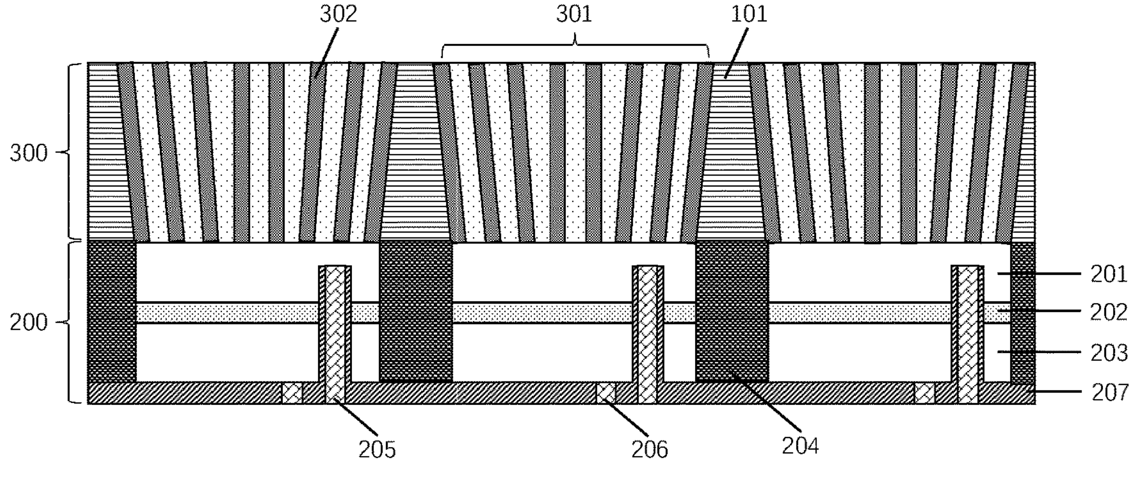
FIG. 2 is a schematic diagram of a semiconductor structure according to another embodiment of the present disclosure.

In this embodiment, FIG. 2 is a schematic diagram of the semiconductor structure according to another embodiment of the present disclosure. As shown in FIG. 2, the porous structure has a hole 302 capable of adsorbing the quantum dot. The hole 302 is columnar in shape and an angle between the hole 302 and a plane where the substrate structure 101 is located ranges from 60° to 120°. The hole 302 may be columnar in shape and perpendicular to the plane where the substrate structure 100 is located, or be columnar in shape and inclined at a certain angle to the plane where the substrate structure 101 is located. By adjusting the angle of the hole 302, a direction of light output is adjusted to increase an angle of light output and improve luminous efficiency of device. A projection shape of the hole 302 on the plane where the substrate structure 101 is located may be any one or more of circular, elliptical, polygonal, elongated, and mesh shapes.

Figure 3:
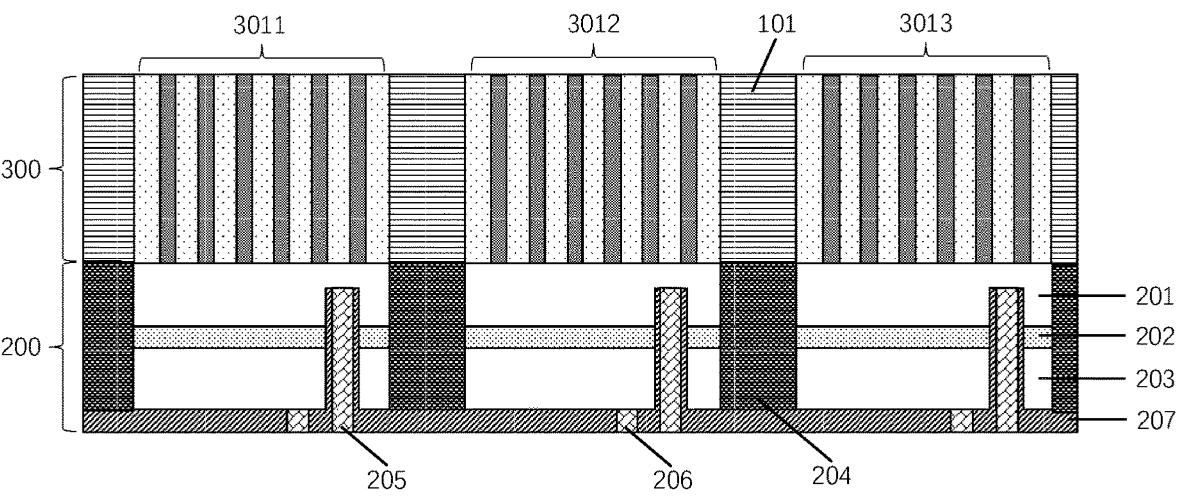
FIG. 3 is a schematic diagram of a semiconductor structure according to another embodiment of the present disclosure.

In this embodiment, FIG. 3 is a schematic diagram of the semiconductor structure according to another embodiment of the present disclosure. As shown in FIG. 3, the light control region 301 includes a first color light region 3011, a second color light region 3012, and a third color light region 3013 horizontally spaced. Optionally, the first color light is red, the second color light is green, and the third color light is blue, which is not limited by this.

Specifically, as shown in FIG. 3, light emitted by the light-emitting structure 200 may be white light. A porous structure of the first color light region 3011 is filled with red quantum dots to form a red light region, a porous structure of the second color light region 3012 is filled with green quantum dots to form a green light region, and a porous structure of the third color light region 3013 is filled with blue quantum dots to form a blue light region, so that three primary colors are formed and a full color LED is achieved. The porous structure is utilized to adsorb quantum dots, so that there is no need to fill optical resist, simplifying a manufacturing process and reducing costs.

Figure 4:
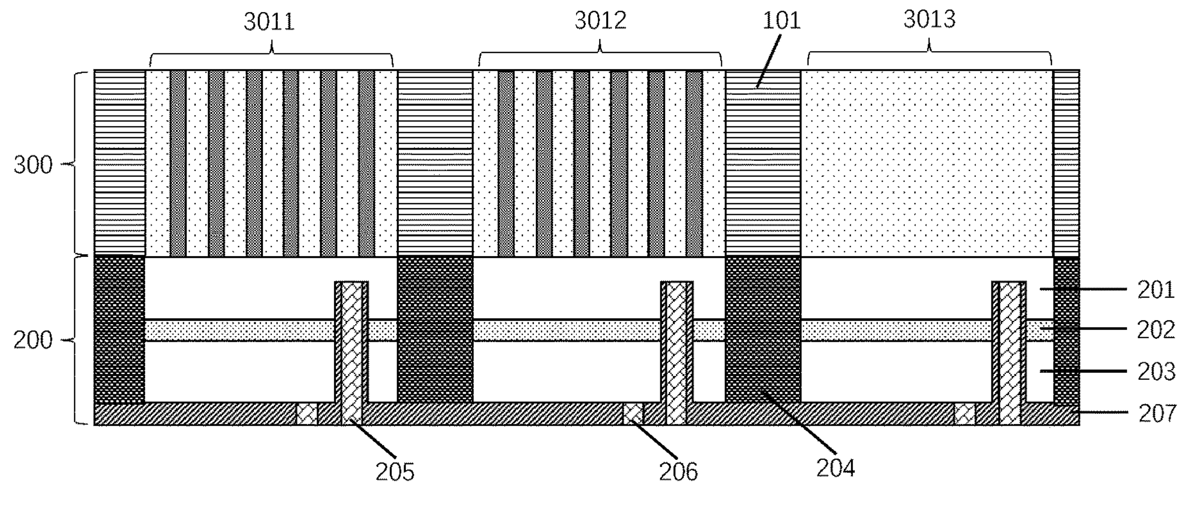
FIG. 4 is a schematic diagram of a semiconductor structure according to another embodiment of the present disclosure.
Figure 5:
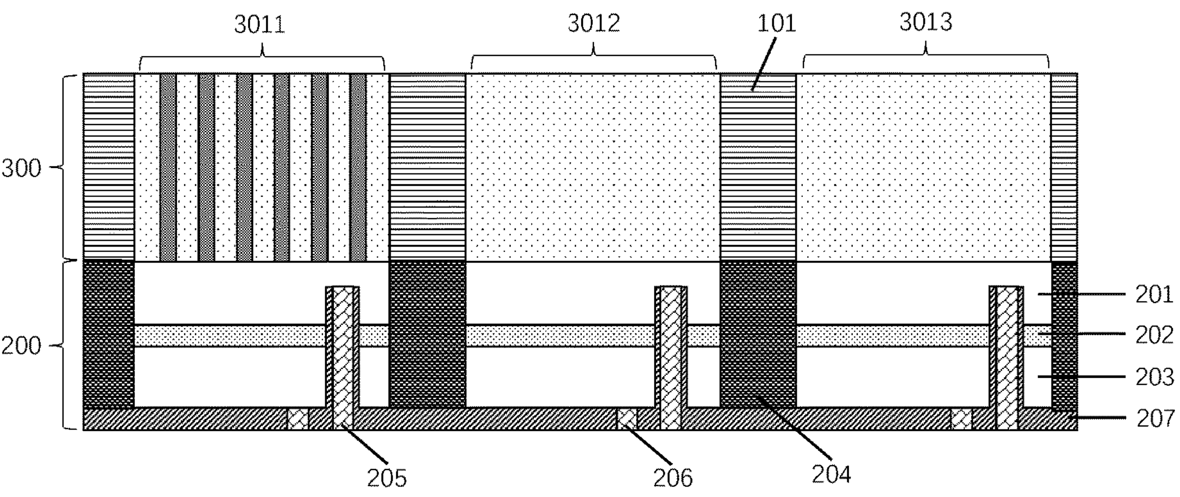
FIG. 5 is a schematic diagram of a semiconductor structure according to another embodiment of the present disclosure.

Optionally, the light control region 301 further includes an opening penetrating through the light control region 301, and the opening and the wavelength conversion structure are arranged horizontally to be separated by a substrate structure 101. As shown in FIG. 4, light emitted by the light-emitting structure 200 may also be blue light. The first color light region 3011 is a wavelength conversion structure, filled with red quantum dots in a porous structure of the first color light region 3011 to form a red light region. The second color light region 3012 is a wavelength conversion structure, filled with green quantum dots in a porous structure of the second color light region 3012 to form a green light region. The third color light region 3013 is an opening filled with optical resist to form a blue light region. Therefore, three primary colors are formed and a full color LED is achieved. As shown in FIG. 5, light emitted by the light-emitting structure 200 may also be blue and green light. The first color light region 3011 is a wavelength conversion structure, filled with red quantum dots in a porous structure of the first color light region 3011 to form a red light region. The second color light region 3012 is an opening filled with optical resist to form a green light region. The third color light region 3013 is an opening, filled with optical resist to form a blue light region. Therefore, three primary colors are formed and a full color LED is achieved.

Figure 6:
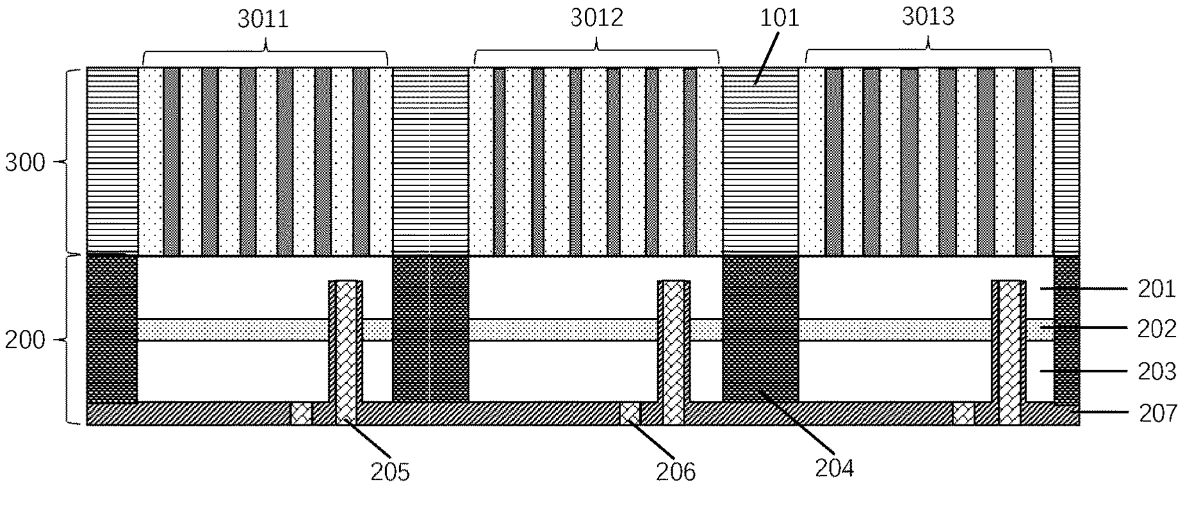
FIG. 6 is a schematic diagram of a semiconductor structure according to another embodiment of the present disclosure.

In this embodiment, FIG. 6 is a schematic diagram of the semiconductor structure according to another embodiment of the present disclosure. A hole proportions of the first color light region 3011, a hole proportions of the second color light region 3012, and a hole proportions of the third color light region 3013 are the same or different. In a green light spectral area near a wavelength of 555 nm, sensitivity of human eyes is the highest, while in an area of longer wavelength (such as red light) or shorter wavelength (such as blue light), the sensitivity of human eyes is reduced, which means that higher radiant flux is required in these wavelength areas to obtain the same brightness perception. By changing the hole proportions in different color light regions, quantum dot content in different color light regions may be changed, thereby adjusting brightness perception of regions with different emission wavelength. As shown in FIG. 6, the hole proportion of the first color light region 3011 that emits red light and the hole proportion of the third color light region 3013 that emits blue light are designed to be greater than the hole proportion of the second color light region 3012 that emits green light, thereby improving the brightness perception of red and blue light.

In this embodiment, as shown in FIG. 1*a*, a light control region 301 corresponds to a light emitting unit. In other embodiments, a light control region 301 may correspond to a plurality of light emitting units. When a light emitting unit is disconnected, other light emitting units may still emit light normally, so that a common "bad spot" problem in the display field may be avoided. There is no special limit on a number of the light emitting units corresponding to a light control region 301, and at least one unit is sufficient. The number of the light emitting units corresponding to the light control region 301 may be determined according to specific device application requirements.

Figure 7:
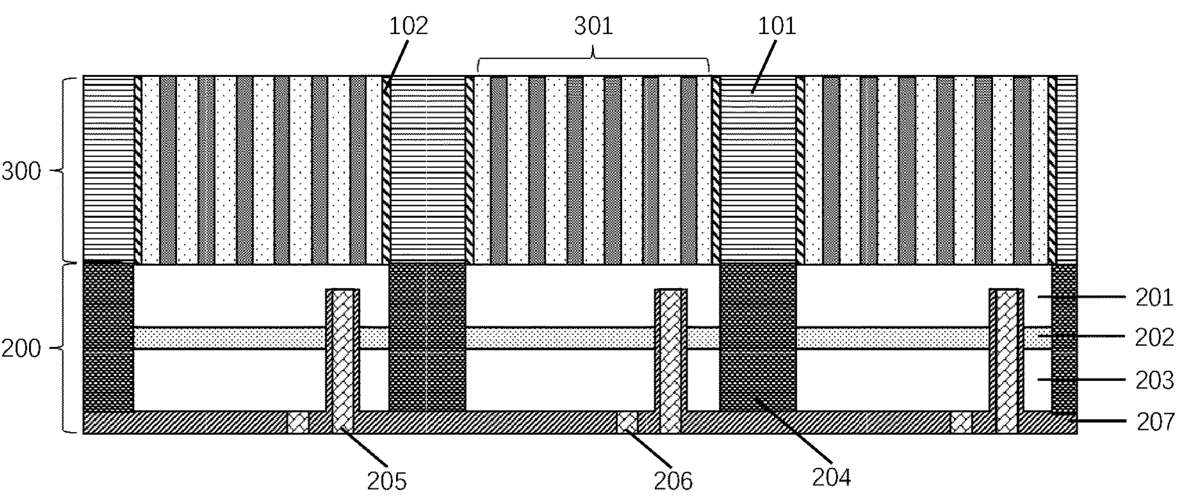
FIG. 7 is a schematic diagram of a semiconductor structure according to another embodiment of the present disclosure.

In some embodiments, FIG. 7 is a schematic diagram of a semiconductor structure according to another embodiment of the present disclosure. As shown in FIG. 7, a side wall of a light control region 301 is provided with a light reflection layer 102. A material of the light reflection layer 102 may be one of silver, aluminum, nickel and other metals that reflect light, or a metal alloy or a metal combination layer composed of multiple metals, or an alloy superlattice structure.

Figures 8, 9:
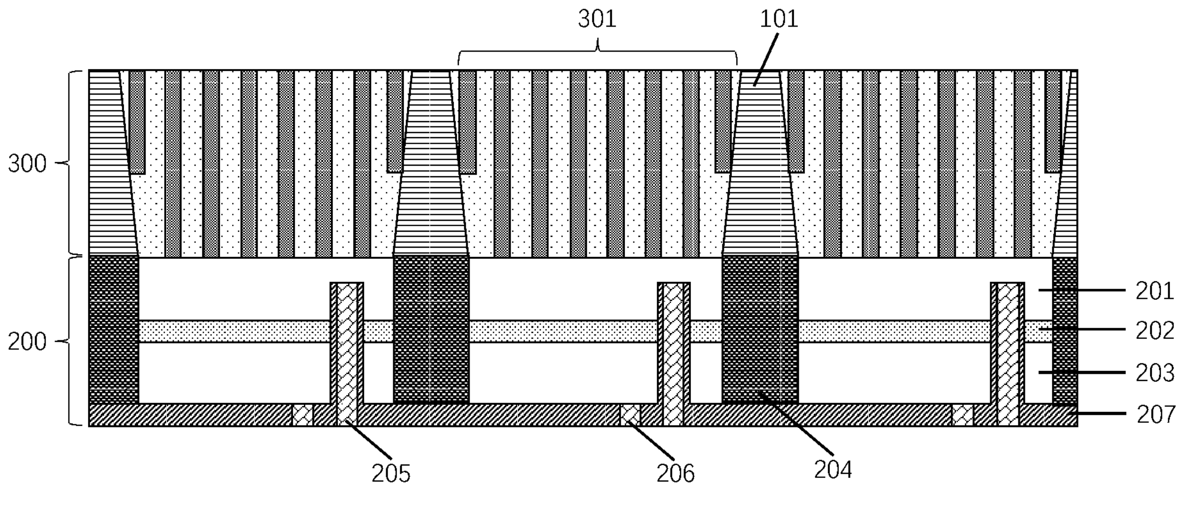
FIG. 8 is a schematic diagram of a semiconductor structure according to another embodiment of the present disclosure.
FIG. 9 is a schematic diagram of a semiconductor structure according to another embodiment of the present disclosure.

In some embodiments, FIG. 8 is a schematic diagram of a semiconductor structure according to another embodiment of the present disclosure. As shown in FIG. 8, a side wall of a light control region 301 is an inclined side wall, so that an equivalent diameter of the light control region 301 increases in a direction of light path. The side wall of the light control region 301 is formed as an inclined side wall. Due to the inclined side wall, the equivalent diameter of a space surrounded by the inclined side wall may increase in the direction of light path, thereby improving light extraction efficiency of a semiconductor device.

In some embodiments, FIG. 9 is a schematic diagram of a semiconductor structure according to another embodiment of the present disclosure. As shown in FIG. 9, a side wall of a light control region 301 is an inclined side wall, so that an equivalent diameter of the light control region 301 increases in a direction of light path. The side wall of the light control region 301 is provided with a light reflection layer 102, further improving luminous efficiency of the device.

Figures 10, 11, 12:
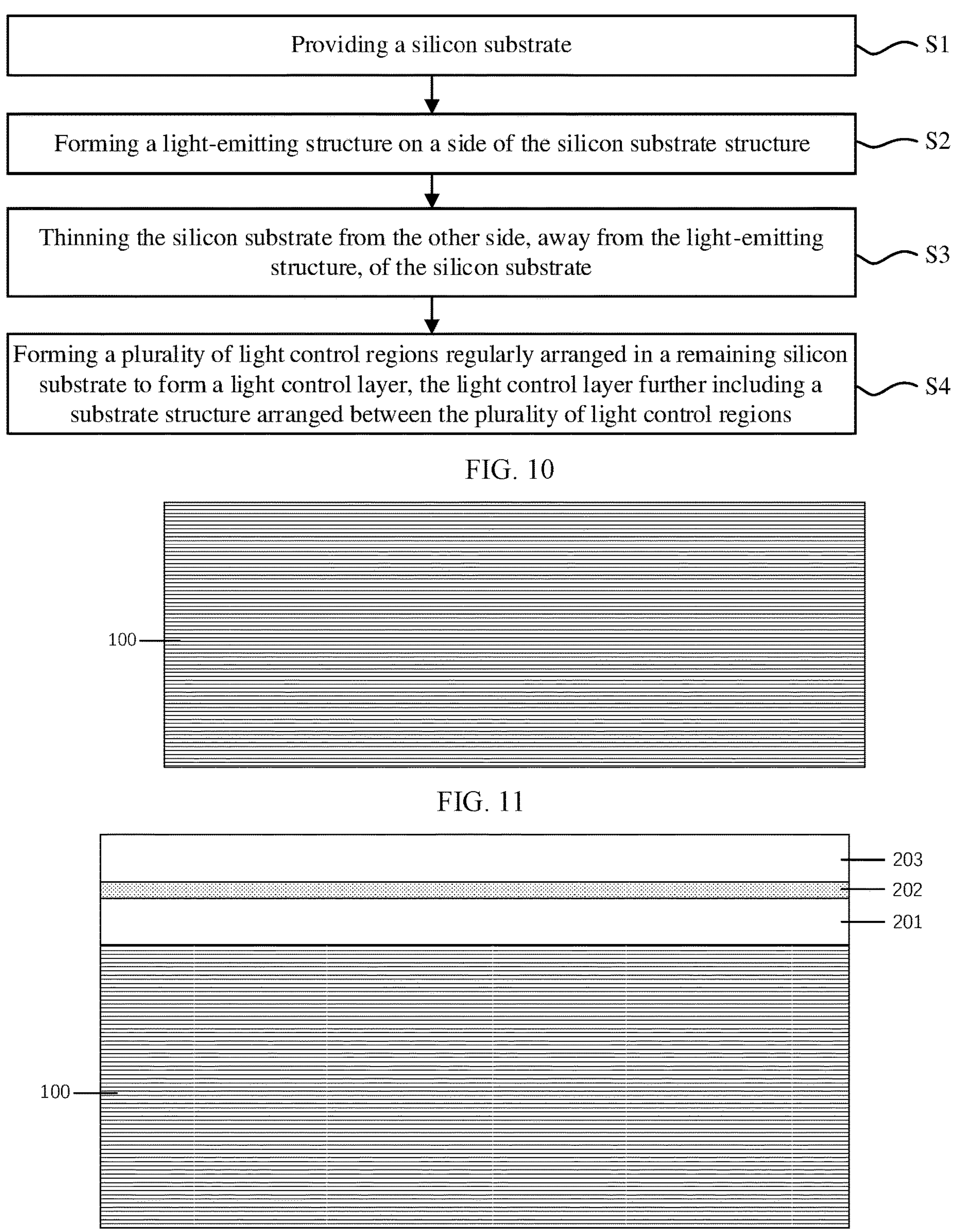
FIG. 10 is a flowchart of a manufacturing method for a semiconductor structure according to an embodiment of the present disclosure.
FIG. 11 to FIG. 21 are schematic decomposition diagrams during a manufacturing process of a semiconductor structure according to an embodiment of the present disclosure.

According to another aspect of the present disclosure, FIG. 10 is a flowchart of a manufacturing method for a semiconductor structure according to an embodiment of the present disclosure, and FIG. 11 to FIG. 21 are schematic decomposition diagrams during a manufacturing process of a semiconductor structure according to an embodiment of the present disclosure. As shown in FIG. 10, a manufacturing method for a semiconductor structure according to an embodiment of the present disclosure includes the following steps.

Step S1: providing a silicon substrate.

Specifically, as shown in FIG. 11, providing a silicon substrate 100.

Step S2: forming a light-emitting structure on a side of the silicon substrate structure.

Specifically, forming a light-emitting structure 200 on a side of the silicon substrate 100.

The light-emitting structure 200 includes a first semiconductor layer 201, an active layer 202, a second semiconductor layer 203, and at least one set of a first electrode 205 and second electrodes 206. Specifically, Step S2 includes the following steps.

As shown in FIG. 12, a first semiconductor layer 201, an active layer 202, and a second semiconductor layer 203 on a side of the silicon substrate sequentially are grown.

A forming process of the first semiconductor layer 201, the active layer 202 and the second semiconductor layer 203 may includes: Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Metal-Organic Chemical Vapor Deposition (MOCVD), or a combination thereof.

Figures 13, 14:
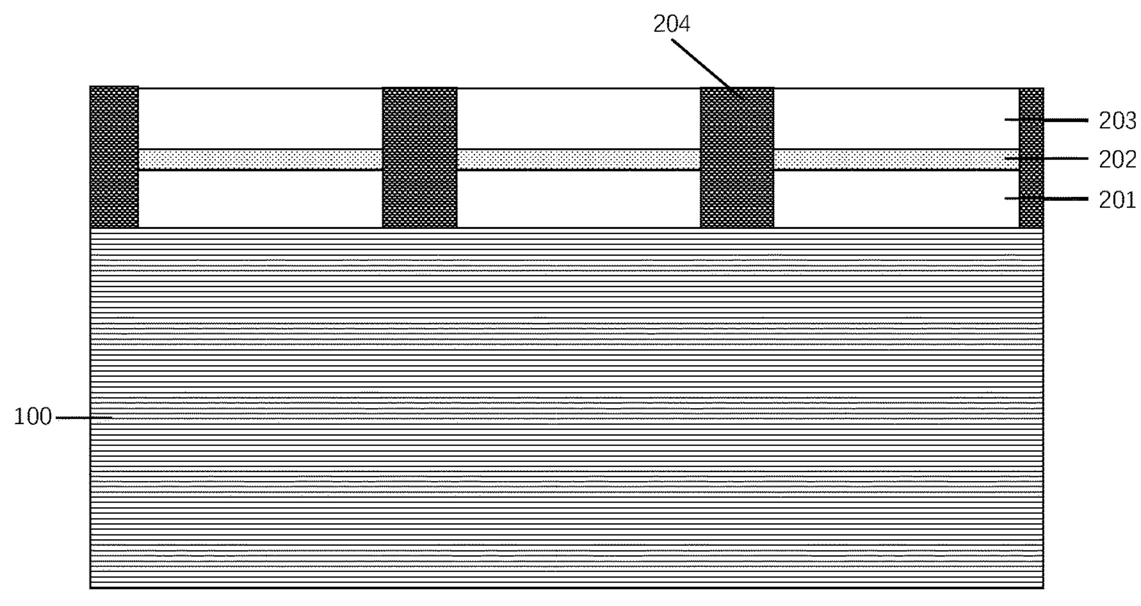

As shown in FIG. 13, an insulation structure 204 between two adjacent light emitting units on a side, away from the silicon substrate 100, of the second semiconductor layer 203 is formed, where a thickness of the insulation structure 204 is less than or equal to a thickness of the light-emitting structure 200. The insulation structure 204 may be formed by ion implantation, and an ion implanted include at least one of hydrogen ion, helium ion, nitrogen ion, and fluorine ion. Optionally, the method of forming the insulation structure 204 between two adjacent light emitting units may includes: etching a groove between the two adjacent light emitting units and filling the groove with an insulating material 207. The method of forming the insulation structure 204 is not limited to this.

As shown in FIG. 14, at least one filling groove 2051 on a side, away from the silicon substrate 100, of the second semiconductor layer 203 is formed, where each of the at least one filling groove 2051 completely penetrates the second semiconductor layer 203, the active layer 202, and partially penetrates the first semiconductor layer 201.

A first electrode 205 in the at least one filling groove 2051 is prepared, where the first electrode 205 is insulated and blocked with the second semiconductor layer 203 and the active layer 202. The first electrode 205 is connected to the first semiconductor layer 201.

A second electrode 206 on a side, away from the active layer 202, of the second semiconductor layer 203 is prepared, where the second electrode 206 is insulated and blocked with the first electrode 205.

Figure 15:
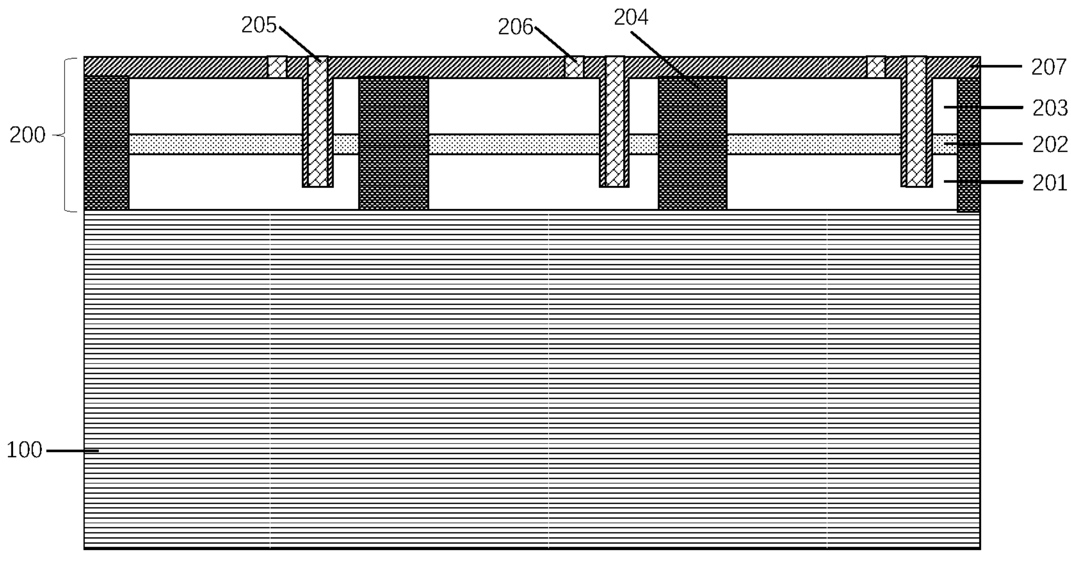

In this embodiment, as shown in FIG. 15, an insulating material 207 is provided between a first electrode 205 and a side wall of a filling groove 2051, thereby achieving insulation blocking between the first electrode 205, a second semiconductor layer 203, and an active layer 202, and connecting the first electrode 205 to a first semiconductor layer 201.

In this embodiment, the insulation material 207 may be silicon dioxide or silicon nitride, but it is not limited by this, and may also be any other applicable insulation materials. Specifically, the insulating material 207 may be directly formed in the filling groove 2051 through chemical vapor deposition and other methods, which may play a role of resistance breaker, without filling, etching, and other processes to realize necessary resistance breaking.

Furthermore, electrode materials for preparing the first electrode 205 and the second electrode 206 may be metals such as gold, copper, silver, zinc, platinum, tantalum, titanium, aluminum, tungsten, nickel, or multiple layers of metals. Embodiments of the present disclosure do not limit this.

Step S3: thinning the silicon substrate from the other side, away from the light-emitting structure, of the silicon substrate.

Figure 16:
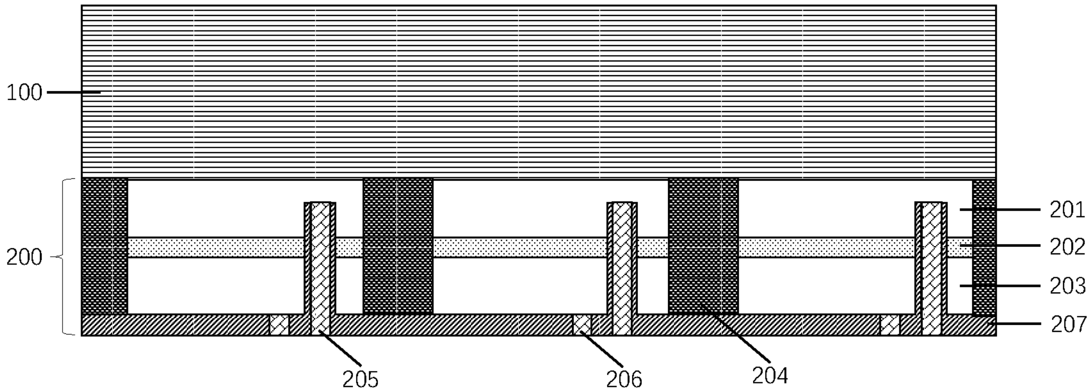

Specifically, as shown in FIG. 16, thinning the silicon substrate 100 from the other side, away from the light-emitting structure 200, of the silicon substrate 100. After the silicon substrate 100 is thinned, a thickness of the remaining silicon substrate is less than or equal to 50 μm.

Step S4: forming a plurality of light control regions regularly arranged in a remaining silicon substrate to form a light control layer, the light control layer further including a substrate structure arranged between the plurality of light control regions.

Figure 17:
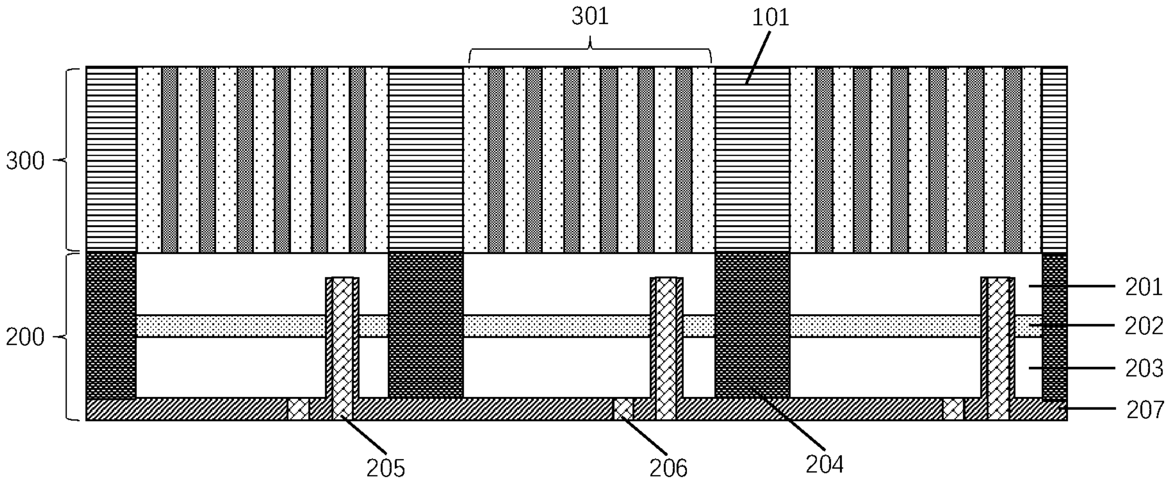

Specifically, as shown in FIG. 17, forming a plurality of light control regions 301 regularly arranged in the remaining silicon substrate to form a light control layer 300. The light control layer 300 further includes a substrate structure 101 arranged between the plurality of light control regions 301. The plurality of light control regions 301 includes a wavelength conversion structure, and the wavelength conversion structure includes a quantum dot and a porous structure adsorbed with the quantum dot.

Specifically, the remaining silicon substrate has a porous structure, and Step S4 further includes the following steps.

The porous structure is oxidized.

The porous structure oxidized with the quantum dot to form a wavelength conversion structure is filled. The porous structure is oxidized from silicon materials of the silicon substrate 100 to silicon oxide materials. On the one hand, the quantum dot may be adsorbed to form a full-color LED. On the other hand, the material of the porous structure is a transparent silicon oxide material that does not affect light output.

In some embodiments, the porous structure is prepared before the light-emitting structure 200 is formed. Step S1 further includes the following steps.

As shown in FIG. 11, a silicon substrate 100 is provided.

Figure 18:
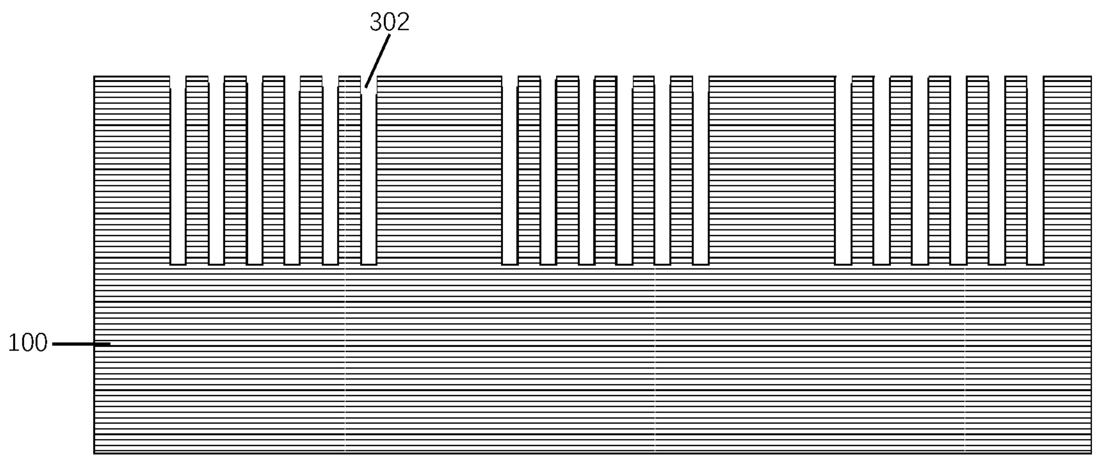

As shown in FIG. 18, a hole 302 on a side, away from a growth surface, of the silicon substrate 100 is prepared, to form a plurality of porous structures regularly arranged.

This embodiment does not limit the manufacturing method for porous silicon, and any manufacturing method for the porous silicon that may be obtained by those skilled in the art may be used in the present disclosure, such as an electrochemical corrosion method (or an anodic oxidation method), a chemical vapor corrosion method, a hydrothermal corrosion method, a chemical corrosion method (or a dyeing method), and etc. A method for preparing the hole 302 may be electrochemical corrosion, using platinum wire or graphite as a cathode and monocrystalline silicon as an anode. The electrochemical corrosion is performed in a mixed solution containing HF acid, and after the silicon substrate 100 is thinned, the electrochemical corrosion is performed on a side, away from the light-emitting structure 200, of the silicon substrate 100 to prepare the hole 302. The electrochemical corrosion method does not need electrodes and autoclaves, so an operation process is safe, convenient and easy to be combined with a current industrial production equipment.

In this embodiment, the hole 302 may be columnar in shape and perpendicular to a plane where the silicon substrate 100 is located or be columnar in shape and inclined at a certain angle to the plane where the silicon substrate 100 is located. A projection shape of the hole 302 on the plane where the silicon substrate 100 is located may be any one or more of circular, elliptical, polygonal, elongated, and mesh shapes.

Figure 19:
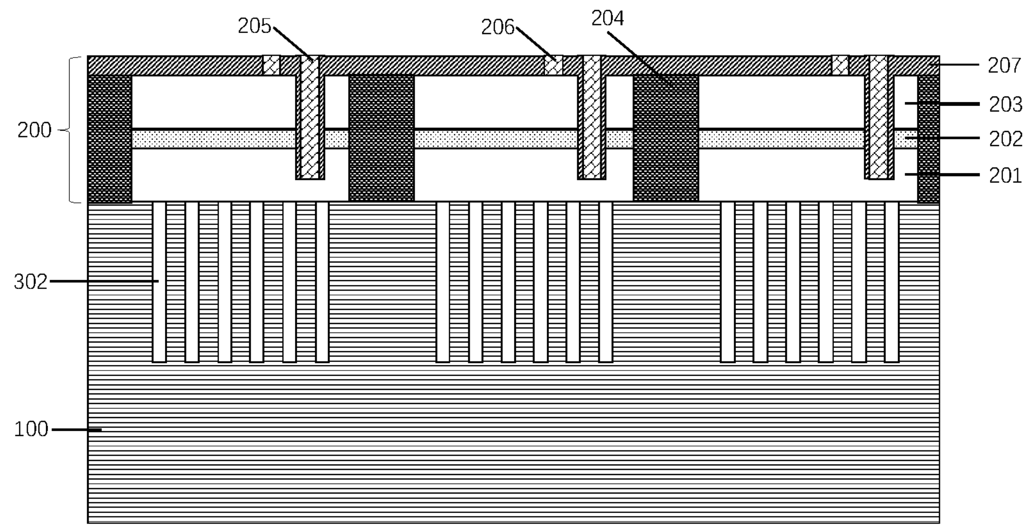
Figure 20:
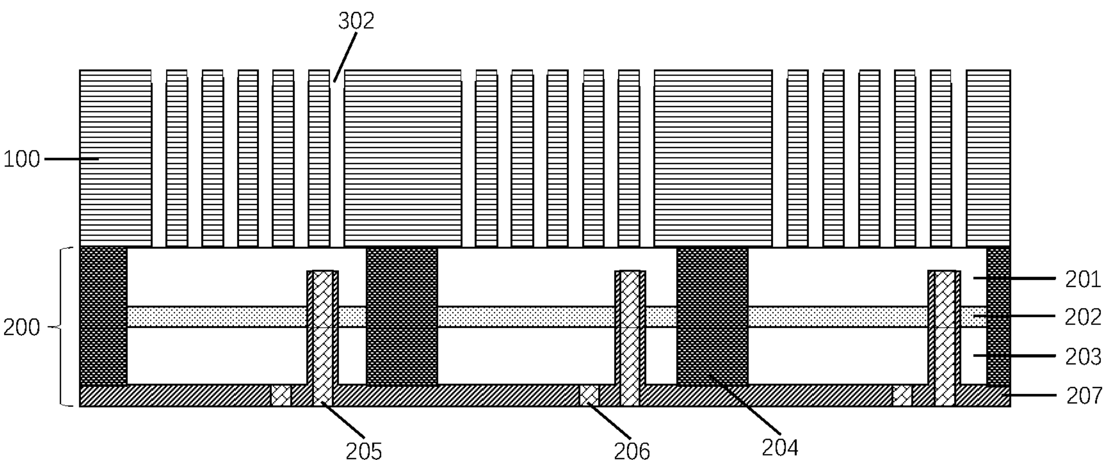

In this embodiment, as shown in FIG. 19, Step S2 is to form a light-emitting structure 200 on a side of the silicon substrate 100 containing a porous structure. As shown in FIG. 20, Step S3 is to thin the silicon substrate 100 from the other side away from the light-emitting structure 200 to expose the porous structure.

In some embodiments, the porous structure is prepared after the silicon substrate 100 is thinned. Step S3 further includes the following steps.

As shown in FIG. 16, the silicon substrate 100 from the other side, away from the light-emitting structure 200, of the silicon substrate 100 is thinned.

As shown in FIG. 20, holes 302 on a side, away from the light-emitting structure 200, of the silicon substrate thinned are prepared to form the plurality of porous structures regularly arranged.

This embodiment does not limit the manufacturing method for porous silicon, and any manufacturing method for the porous silicon that may be obtained by those skilled in the art may be used in the present disclosure, such as an electrochemical corrosion method (or an anodic oxidation method), a chemical vapor corrosion method, a hydrothermal corrosion method, a chemical corrosion method (or a dyeing method), and etc. Preferably, a method for preparing the hole 302 may be electrochemical corrosion, using platinum wire or graphite as a cathode and monocrystalline silicon as an anode. The electrochemical corrosion is performed in a mixed solution containing HF acid, and after the silicon substrate 100 is thinned, the electrochemical corrosion is performed on a side, away from the light-emitting structure 200, of the silicon substrate 100 to prepare the hole 302. The electrochemical corrosion method does not need electrodes and autoclaves, so an operation process is safe, convenient and easy to be combined with a current industrial production equipment.

In this embodiment, the hole 302 may be columnar in shape and perpendicular to a plane where the silicon substrate 100 is located or be columnar in shape and inclined at a certain angle to the plane where the silicon substrate 100 is located. A projection shape of the hole 302 on the plane where the silicon substrate 100 is located may be any one or more of circular, elliptical, polygonal, elongated, and mesh shapes.

In some embodiments, a light reflection layer 102 may be prepared between the light control regions 301 and the substrate structure 101 by etching and filling grooves. As shown in FIG. 7, a material of the light reflection layer 102 may be one of silver, aluminum, nickel and other metals that reflect light, or a metal alloy or a metal combination layer composed of multiple metals, or an alloy superlattice structure.

In some embodiments, a side wall of the light control region 301 may be designed to be an inclined side wall, so that an equivalent diameter of the light control region 301 increases in a direction of light path. As shown in FIG. 8, the side wall of the light control region 301 is formed as an inclined side wall. Due to the inclined side wall, the equivalent diameter of a space surrounded by the inclined side wall may increase in the direction of light path, thereby improving light extraction efficiency of a semiconductor device.

In some embodiments, the side wall of the light control region 301 may be designed to be an inclined side wall, so that an equivalent diameter of the light control region 301 increases in a direction of light path. As shown in FIG. 9, the side wall of the light control region 301 is provided with a light reflection layer 102, further improving luminous efficiency of the device.

Figure 21:
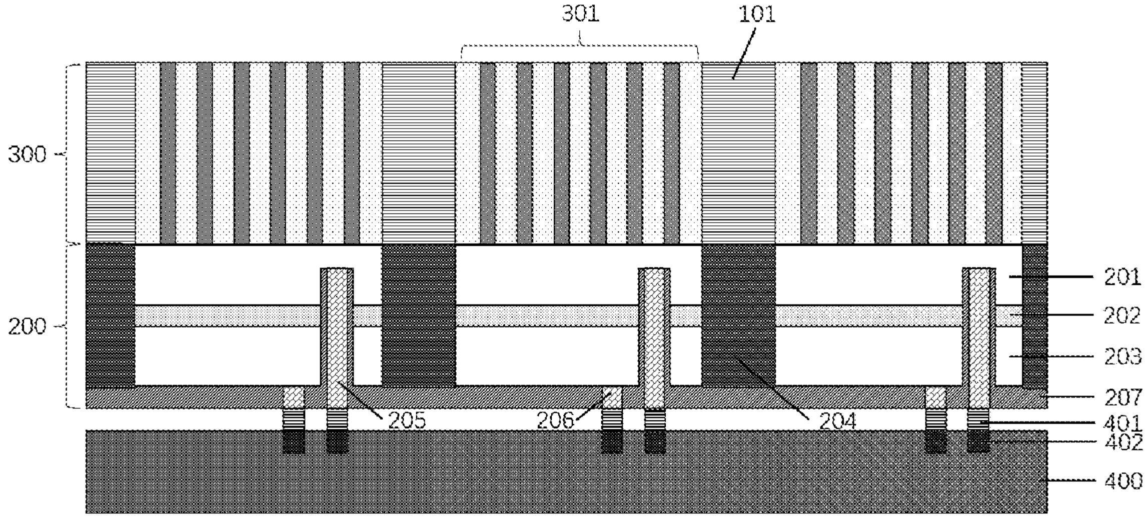

The semiconductor structure in the embodiment according to the present disclosure requires driving of an external driving circuit 400 to emit light. As shown in FIG. 21, specifically, a first electrode 205 and a second electrode 206 may be connected to a electrode bonding pad 402 in the external driving circuit 400 through an conductive structure 401. In addition, the driving circuit 400 may be made into an active or passive driving mode. The active driving method has a fast response speed and is not limited by the number of scanning electrodes. Each pixel unit may be individually addressed and controlled, making it suitable for most applications. The passive driving method, which uses progressive scanning to achieve displaying, has low production costs and technical threshold, but may not achieve high resolution display.

According to another aspect of the present disclosure, the present disclosure also provides a display panel described above, including a semiconductor structure. The hole 302 of the light control region 301 in the middle part of the display panel is a columnar in shape perpendicular to a plane where the silicon substrate 100 is located, and the hole 302 of a light control region 301 in the edge part of the display panel is a columnar in shape inclined towards the middle of the display panel at a certain angle to the plane where the silicon substrate 100 is located, to alleviate a problem of uneven display caused by edge area light leakage.

In conclusion, the present disclosure provides a semiconductor structure and a manufacturing method for a semiconductor structure. The semiconductor structure includes a light-emitting structure; a light control layer disposed on a side of the light-emitting structure, including a plurality of light control regions regularly arranged and a substrate structure located between the plurality of light control regions; where the plurality of light control regions include a wavelength conversion structure, and the wavelength conversion structure includes a quantum dot and a porous structure adsorbed with the quantum dot. In the present disclosure, the plurality of light control regions and the substrate structure are provided to ensure uniform light output, good directionality, high light extraction rate, and avoidance of light crosstalk in each light control region. The porous structure is utilized to adsorb the quantum dot and achieve a full color display, thereby improving resolution, simplifying a manufacturing process and reducing costs.

It should be understood that the terms "include" and variations thereof used in the present application are open ended, that is, "including but not limited to". The term "an embodiment" means "at least one embodiment"; the term "another embodiment" means "at least one further embodiment". In the specification, the schematic representation of the above terms does not necessarily refer to the same embodiment or example. Furthermore, the particular features, structures, materials, or characteristics described may be combined in any suitable manner in any one or more embodiments or examples. In addition, in the case of no contradiction, a person skilled in the art may combine different embodiments or examples described in the specification and features of different embodiments or examples.

The above embodiments only the preferred embodiments of the present application, and are not intended to limit the present application. Any modification, equivalent replacement, etc. made within the spirit and principles of the present application should be included in the scope of protection of the present application.

What is claimed is:

1. A semiconductor structure, comprising:

a light-emitting structure;

a light control layer disposed on a side of the light-emitting structure, wherein the light control layer comprises a plurality of light control regions regularly arranged and a substrate structure located between the plurality of light control regions, wherein the plurality of light control regions comprise a wavelength conversion structure, and the wavelength conversion structure comprises a quantum dot and a porous structure adsorbed with the quantum dot, and a material of the substrate structure comprises silicon, and a material of the porous structure comprises porous silicon oxide.

2. The semiconductor structure according to claim 1, wherein the porous structure has a hole capable of adsorbing the quantum dot, the hole is columnar in shape, and an angle between the hole and a plane where the substrate structure is located ranges from 60° to 120°.

3. The semiconductor structure according to claim 1, wherein each of the plurality of light control regions further comprises an opening penetrating through the each of the plurality of light control regions, and the opening and the wavelength conversion structure are arranged horizontally to be separated by the substrate structure.

4. The semiconductor structure according to claim 1, wherein a thickness of the light control layer, a thickness of the plurality of light control regions, and a thickness of the substrate structure are the same.

5. The semiconductor structure according to claim 1, wherein a thickness of the light control layer is less than or equal to 50 μm.

6. The semiconductor structure according to claim 1, wherein a side wall of the plurality of light control regions is provided with a light reflection layer.

7. The semiconductor structure according to claim 1, wherein a side wall of the plurality of light control regions is an inclined side wall, so that an equivalent diameter of the plurality of light control regions increases in a direction of light path.

8. The semiconductor structure according to claim 1, wherein the light-emitting structure comprises: a first semiconductor layer, an active layer, a second semiconductor layer, and at least one set of a first electrode and a second electrode;

the first electrode is connected to the first semiconductor layer and blocked with the second semiconductor layer and the active layer through an insulating material; and the second electrode is connected to the second semiconductor layer and blocked with the first electrode through an insulating material.

9. The semiconductor structure according to claim 1, wherein the light-emitting structure comprises a plurality of light-emitting units, an insulation structure is arranged between two adjacent light-emitting units, and a thickness of the insulation structure is less than or equal to a thickness of the light-emitting structure.

10. The semiconductor structure according to claim 1, wherein the plurality of light control regions comprise a first color light region, a second color light region, and a third color light region horizontally spaced.

11. The semiconductor structure according to claim 10, wherein a hole proportion of the first color light region, a hole proportion of the second color light region, and a hole proportion of the third color light region are the same or different.

12. A manufacturing method for a semiconductor structure, comprising:

providing a silicon substrate;

forming a light-emitting structure on a side of the silicon substrate;

thinning the silicon substrate from the other side, away from the light-emitting structure, of the silicon substrate; and forming a plurality of light control regions regularly arranged in a remaining silicon substrate to form a light control layer, the light control layer further comprising a substrate structure arranged between the plurality of light control regions;

wherein the plurality of light control regions comprise a wavelength conversion structure, and the wavelength conversion structure comprises a quantum dot and a porous structure adsorbed with the quantum dot, and a material of the substrate structure comprises silicon, and a material of the porous structure comprises porous silicon oxide.

13. The manufacturing method for a semiconductor structure according to claim 12, wherein a manufacturing method for the porous structure is to perform corrosion on a side, away from the light-emitting structure, of the silicon substrate after thinning the silicon substrate.

14. The manufacturing method for a semiconductor structure according to claim 12, wherein the forming a plurality of light control regions regularly arranged in a remaining silicon substrate to form a light control layer further comprises:

oxidizing the porous structure; and filling the porous structure oxidized with the quantum dot to form a wavelength conversion structure.

15. The manufacturing method for a semiconductor structure according to claim 12, wherein the thinning the silicon substrate from the other side, away from the light-emitting structure, of the silicon substrate further comprises:

preparing holes on a side, away from the light-emitting structure, of the silicon substrate thinned to form the plurality of porous structures regularly arranged.

16. The manufacturing method for a semiconductor structure according to claim 12, wherein the providing a silicon substrate further comprises:

preparing a hole on a side, away from a growth surface, of the silicon substrate to form a plurality of porous structures regularly arranged.

17. The manufacturing method for a semiconductor structure according to claim 16, wherein the forming a light-emitting structure on a side of the silicon substrate comprises forming the light-emitting structure on a side of the silicon substrate containing the plurality of porous structures, and the thinning the silicon substrate from the other side, away from the light-emitting structure, of the silicon substrate comprises thinning the silicon substrate from the other side, away from the light-emitting structure, of the silicon substrate to expose the plurality of porous structures.

18. The manufacturing method for a semiconductor structure according to claim 12, wherein the forming a light-emitting structure on a side of the silicon substrate further comprises:

growing a first semiconductor layer, an active layer, and a second semiconductor layer on a side of the silicon substrate sequentially;

forming at least one filling groove on a side, away from the silicon substrate, of the second semiconductor layer, wherein each of the at least one filling groove completely penetrates the second semiconductor layer, the active layer, and partially penetrates the first semiconductor layer;

preparing a first electrode in the at least one filling groove, wherein the first electrode is insulated and blocked with the second semiconductor layer and the active layer, and the first electrode is connected to the first semiconductor layer; and preparing a second electrode on a side, away from the active layer, of the second semiconductor layer, wherein the second electrode is insulated and blocked with the first electrode.

19. The manufacturing method for a semiconductor structure according to claim 18, wherein the light-emitting structure comprises a plurality of light-emitting units, and after the growing a first semiconductor layer, an active layer, and a second semiconductor layer on a side of the silicon substrate sequentially, the manufacturing method for a semiconductor structure further comprises:

forming an insulation structure between two adjacent light emitting units on a side, away from the silicon substrate, of the second semiconductor layer, wherein a thickness of the insulation structure is less than or equal to a thickness of the light-emitting structure.

* * * * *